United States Patent [19]

Bell

[11] Patent Number: 4,975,877
[45] Date of Patent: Dec. 4, 1990

[54] STATIC SEMICONDUCTOR MEMORY WITH IMPROVED WRITE RECOVERY AND COLUMN ADDRESS CIRCUITRY

[75] Inventor: Antony G. Bell, Los Altos, Calif.

[73] Assignee: Logic Devices Incorporated, Sunnyvale, Calif.

[21] Appl. No.: 260,396

[22] Filed: Oct. 20, 1988

[51] Int. Cl.[5] .................. G11C 11/407; G11C 11/408; G11C 11/409

[52] U.S. Cl. ................. 365/189.01; 365/189.02; 365/203; 365/230.02

[58] Field of Search ................... 365/154, 156, 189.11, 365/189.01, 189.06, 189.02, 202, 203, 230.01, 230.02

[56] References Cited

U.S. PATENT DOCUMENTS

| 4,099,265 | 7/1978 | Abe | 365/202 X |
|---|---|---|---|
| 4,110,840 | 0/1978 | Abe et al. | 365/203 |
| 4,499,559 | 0/1985 | Kurafuji | 365/190 |
| 4,639,898 | 0/1987 | Sauer | 365/202 |
| 4,712,194 | 0/1987 | Yamaguchi et al. | 365/203 |
| 4,730,279 | 0/1988 | Ohtani | 365/203 |
| 4,758,990 | 7/1988 | Uchida | 365/190 |
| 4,760,561 | 7/1988 | Yamamoto et al. | 365/190 |
| 4,791,613 | 12/1988 | Hardee | 365/190 X |
| 4,792,928 | 12/1988 | Tobita | 365/202 |
| 4,813,022 | 3/1989 | Matsui et al. | 365/190 X |
| 4,825,413 | 4/1989 | Tran | 365/190 X |

OTHER PUBLICATIONS

Sood et al., "A 25 ns 2K X 8 HMOS Static RAM", *IEEE Journal of Solid State Circuits*, vol. SC-18, No. 5, Oct. 1983, pp. 498–508.

Chen et al., "A Fast 32K X 8 CMOS Static RAM with Address Transition Detection", *IEEE Journal of Solid-State Circuits*, vol. SC-22, No. 4, Aug. 1987, pp. 533–537.

Matsui, et al., "A 25-ns 1-Mbit CMOS SRAM with Loading-Free Bit Lines", *IEEE Journal of Solid State Circuits*, vol. SC-22, No. 5, Oct. 1987, pp. 733–740.

Chu et al., "A 25-ns Low-Power Full-CMOS 1-Mbit (128K X 8) SPRAM", *IEEE Journal of Solid-State Circuits*, vol. 23, No. 5, Oct. 1988, pp. 1078–1084.

Wang et al., "A 21-ns 32K X 8 CMOS Static RAM with a Selectively Pumped p-Well Array", *IEEE Journal of Solid-State Circuits*, vol. SC-22, No. 5, Oct. 1987, pp. 704–711.

Kertis et al., "A 12-ns ECL I/O 256K X 1-bit SRAM Using a 1 μm BiCMOS Technology", *IEEE Journal of Solid-State Circuits*, vol. 23, No. 5, Oct. 1988, pp. 1048–1053.

Cissou et al., "A High Speed 65-kbit CMOS RAM", *IEEE Journal of Solid-State Circuits*, vol. SC-21, No. 3, Jun. 1986, pp. 390–395.

Primary Examiner—Alyssa H. Bowler
Attorney, Agent, or Firm—Majestic, Parsons, Siebert & Hsue

[57] ABSTRACT

A static random access memory (SRAM) having a reduced access time for reading and reduced probability of inadvertent writing operations. Switching circuits (multiplexers) that are used to connect column bit lines with reading and writing circuits of the memory are divided into separate circuits for use during read and write operations. A recovery pulse is applied only to bit lines of a column just written to by use of the driving circuits through the same column line switching circuits.

14 Claims, 5 Drawing Sheets

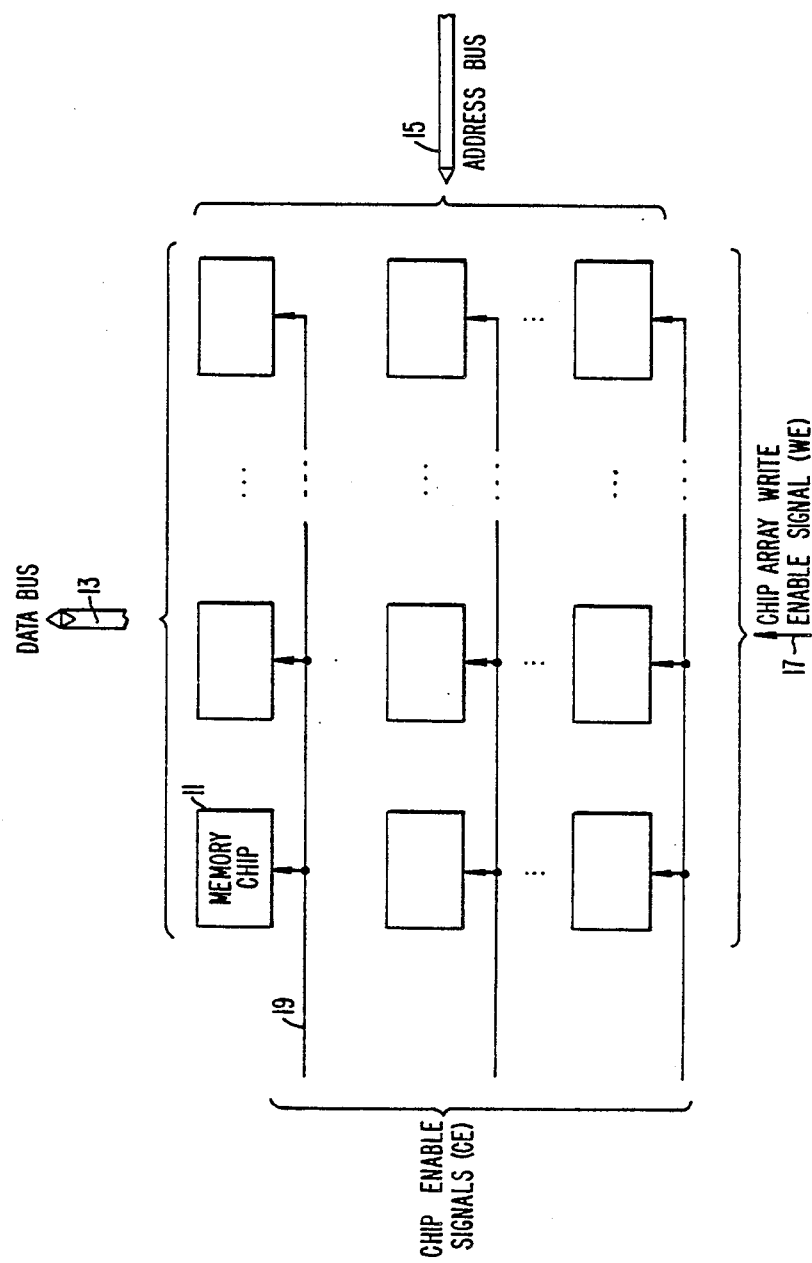
FIG._1. PRIOR ART

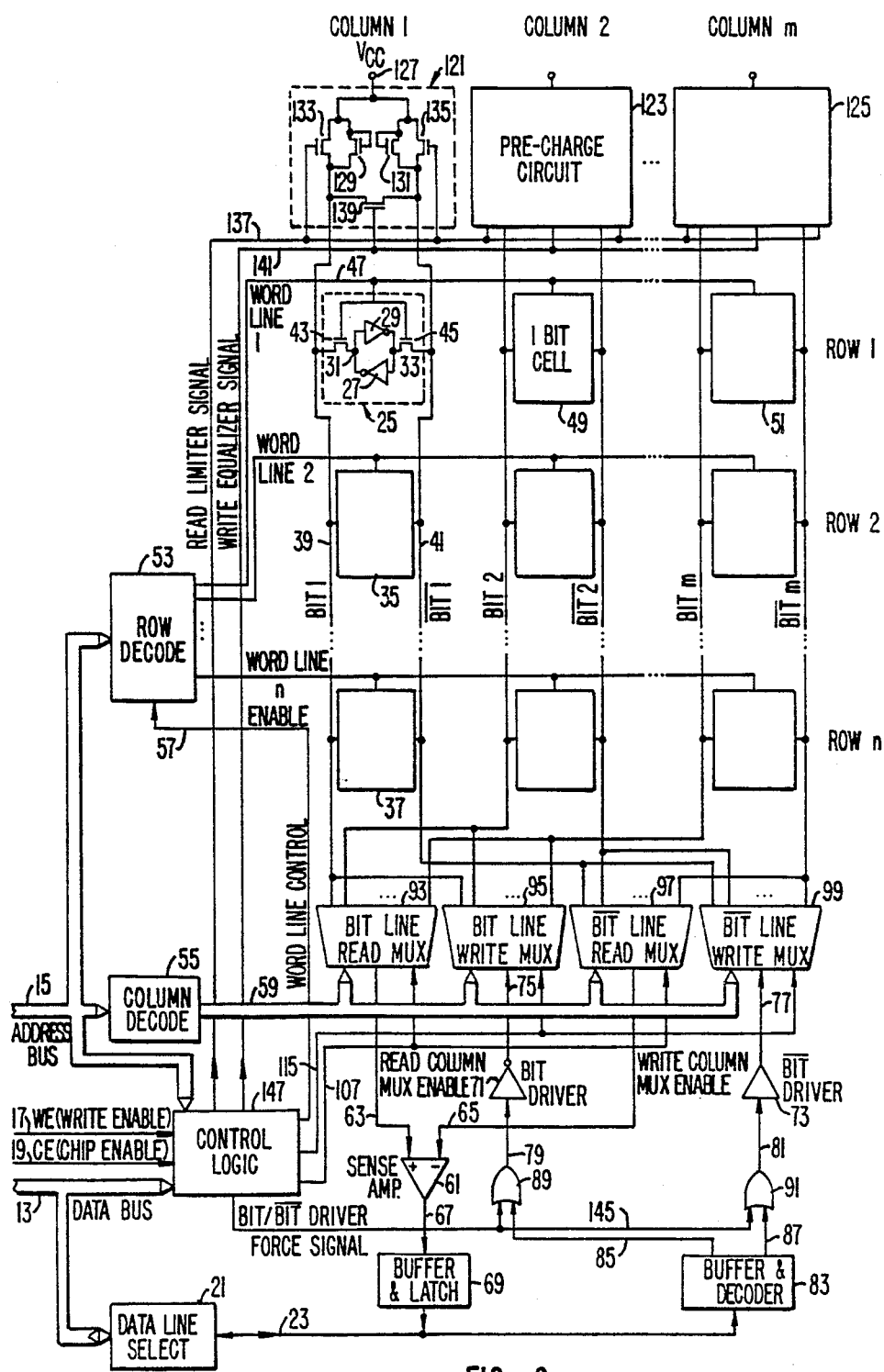
FIG._2.

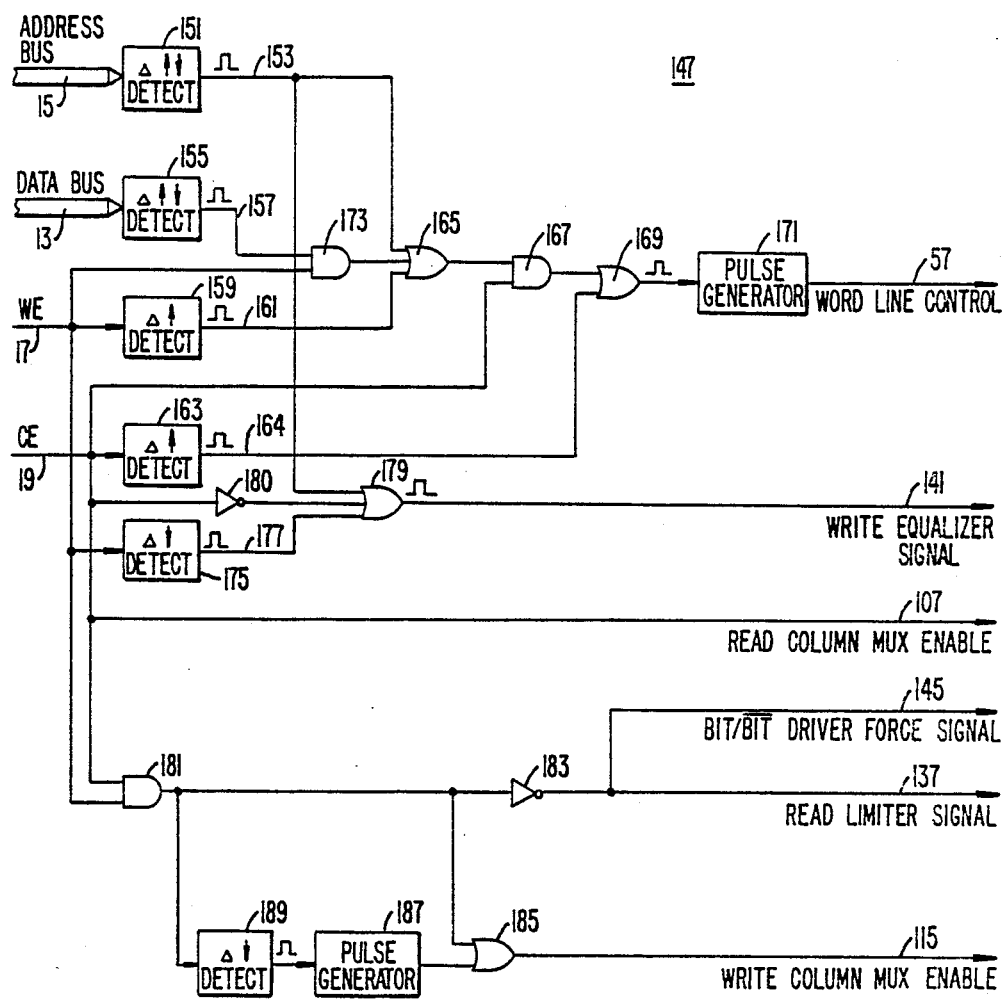
FIG._3.

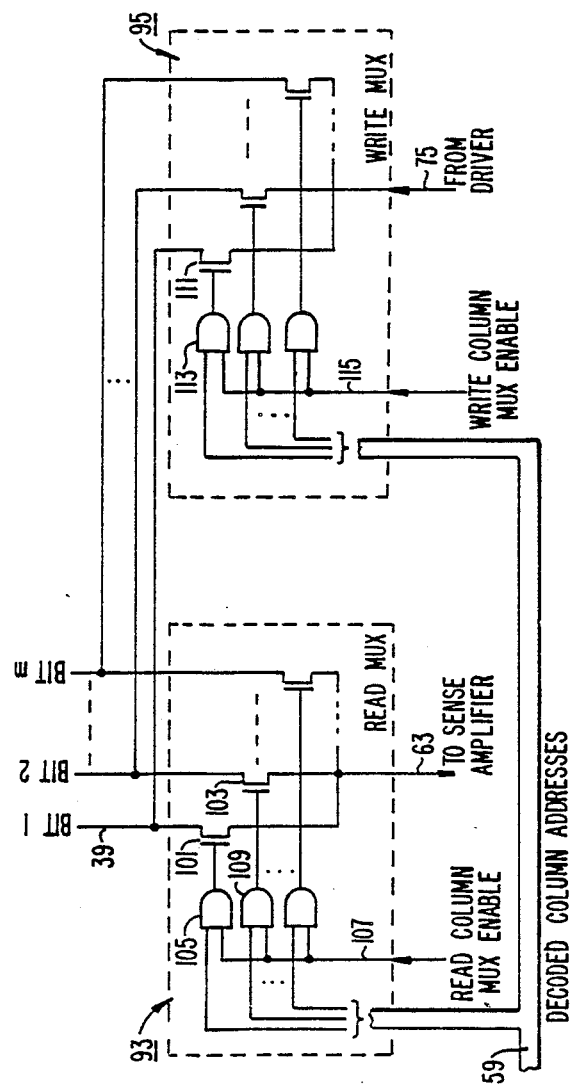
FIG._4.

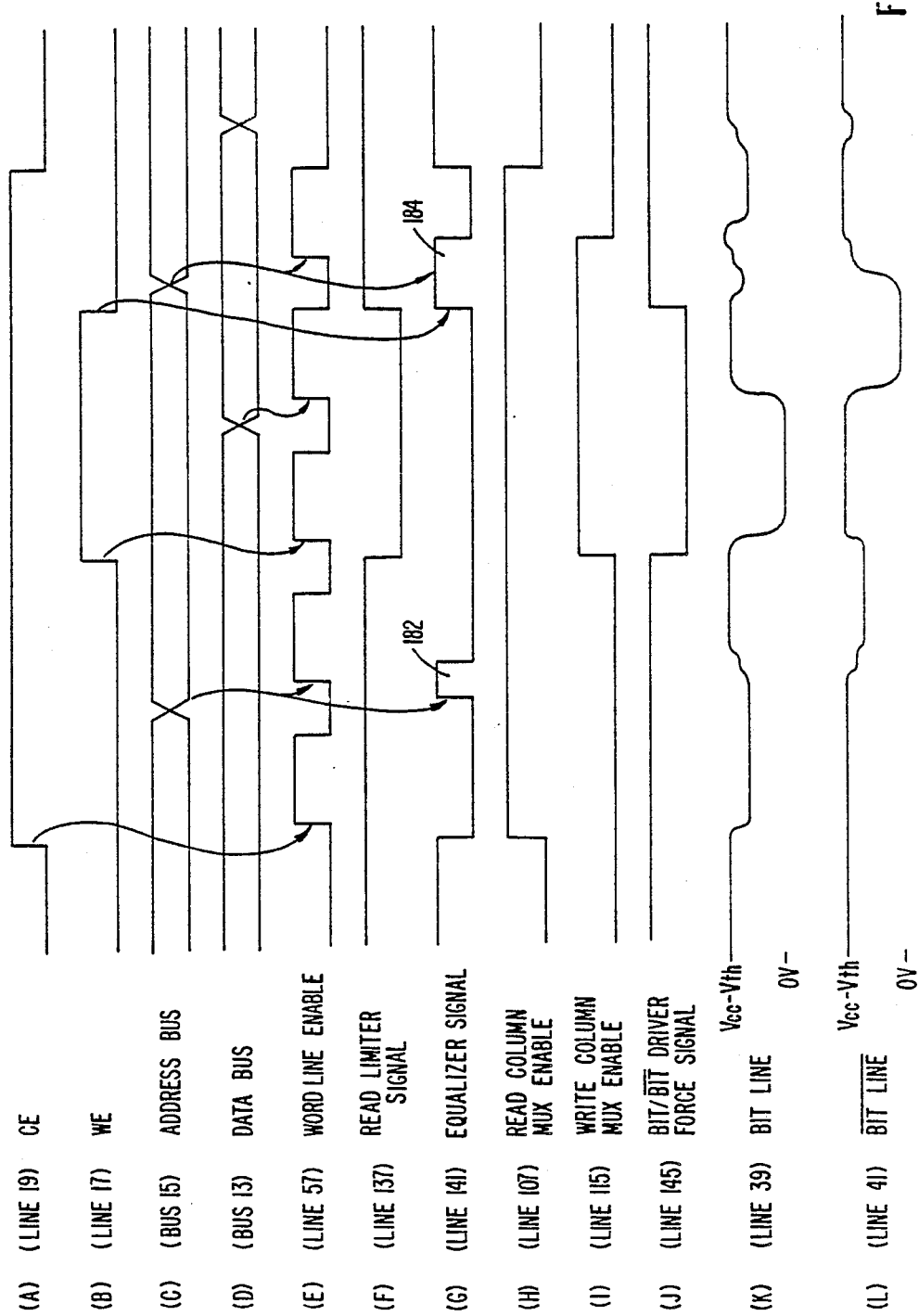

STATIC SEMICONDUCTOR MEMORY WITH IMPROVED WRITE RECOVERY AND COLUMN ADDRESS CIRCUITRY

BACKGROUND OF THE INVENTION

This invention relates generally to static random-access-memory (SRAM), and more specifically to circuit improvements in such devices that allow faster operation and reduce the chance of unintentionally changing the states of stored data bits that are not desired to be changed.

By far the most widely used type of semiconductor memory is a dynamic random-access-memory (DRAM) because of its relatively low cost due to a high packing density of memory bit cells. However, DRAMs require a great deal of overhead circuitry, including circuits that periodically refresh the state of each of the bit cells. The SRAM requires no refreshing and generally has a faster access time, but suffers from the disadvantage that each bit cell is much larger than that of a DRAM. Therefore, a given semiconductor chip area of SRAM has significantly fewer number of storage cells than does an equal area of DRAM. But primarily because of the faster access time, SRAMs are used in many computer applications where that characteristic is important and thus the extra cost is justified. Many sophisticated general purpose computers use SRAM for a small part of its system memory, such as for a cache memory, and DRAM for the bulk of the memory.

A typical SRAM includes a separate memory cell circuit for each bit of information to be stored in the memory. Each bit cell circuit is in the nature of a flip-flop. It has two stable states. Its state is read by monitoring the voltage across it. If one side of the cell is high and the other is low, the bit cell is considered to be in one state, but if that voltage is reversed, it is considered to be in its second state. A cell's state is changed by applying an opposite voltage pulse across it.

SRAM arrays are organized with its bit cells in columns and rows. A plurality of such cells are arranged in a column with one side of each connected through a transistor switch to one column bit line and the other side of each connected through another transistor switch to a second column bit line. A number of such columns are utilized. A word control line is connected to the transistor switches of each cell in a row of cells extending across many columns. Proper energization of one word line thus connects the memory cells in one row to their respective column bit lines.

Reading the state of a cell in an array of cells is accomplished by a single reading circuit. Similarly, a single writing circuit is provided for an array of cells. A particular cell is addressed for reading or writing by properly energizing the word line in the row in which the cell exists, and by connecting the read or write circuits to the column bit lines in which the cell exists. The correct column bit lines are connected to the read or write circuits through an addressable decoding or multiplexing circuit. Under these conditions, only a single cell in the addressed column is connected to the column bit lines, that being the one in the row whose word line is addressed, and thus only that one cell is connected to the read or write circuits.

The reading circuit includes, as a primary component, a sense amplifier. Reading of an addressed cell is accomplished by connection of its column bit lines to the sense amplifier. The relative potential on the addressed column bit lines is measured to determine the state of the selected memory cell. If one bit line has a higher voltage than the other, then it is in one state, and if the voltages are reversed, then it is in the other state.

The state of an addressed cell is changed by addressing it in the same manner but then connecting the bit lines of the column in which the cell lies to the writing circuit. The writing circuit forces the cell to be switched in state by driving one of its bit lines high and simultaneously the other bit line low. When the writing circuit is disconnected from the addressed cell, the cell will stay in its new state until reversed by another writing process.

The usual SRAM circuit, when inactive, maintains all the bit lines at a voltage intermediate of the voltage difference across a memory cell. Thus, when a particular cell is addressed for reading its state, the bit lines to which it is connected begin at this intermediate voltage. This voltage is maintained by connection to a source through a reasonably high impedance, however, so that connection of the voltage difference across the cell to a pair of bit lines in a given column rapidly causes those voltages to change. It is this changing voltage in the bit lines of the addressed cell column that are sensed by the sense amplifier. The speed of the reading process is maximized by use of a very sensitive sense amplifier which can very early detect the direction of the voltage swing in the addressed column bit lines after the cell is connected to them by energizing the word line for the row of cells in which the addressed cell lies.

When writing a bit into an addressed cell by the write driving circuit being connected to the bit lines of an addressed column, the driving circuit rapidly changes the steady state equal voltages on the bit lines by raising one and lowering the other. After this, when the cell written to has been disconnected from its bit lines by its word line signal going inactive, the voltage on those bit lines is unequal, an undesirable condition in case some other cell in that column is next to be read. The memory must wait for those bit lines to come to an equal voltage before a reading operation of another cell in that column can be accomplished. The bit line voltages will be equalized in time because of their connection through a high impedance to a voltage source In order to speed up the process, however, all of the bit lines in the array or portion of array are pulsed, immediately after a single cell has been written, with a voltage to restore the bit lines of the column of the addressed cell to the desired equal level. The bit lines of each column are usually also connected together during this interval, the combination of events is designed to restore a pair of bit lines to an equal voltage condition so that a cell in that one column can be read.

This unequal bit line condition after a writing operation is also undesirable for another reason. If another cell in the column just written to is addressed too soon for reading, while the unequal bit line voltages are still far enough apart to be able to switch the state of a cell, that cell's state can be undesirably changed by the unequal voltage.

It is a primary object of the present invention to provide an SRAM from which stored data can be read with improved speed.

It is a more specific object of the present invention to provide an improved circuit technique for restoring to an equal voltage a pair of column bit lines which have just been driven unequal in the course of a writing operation.

SUMMARY OF THE INVENTION

These and additional objects are accomplished by a combination of a number of improvements in techniques and circuit implementations within a static random-access-memory (SRAM). One of these improvements is the application of the bit line voltage restoring pulse through the column selecting circuitry, usually a multiplexer, to the bit lines of a column just written to. The restoring pulse is then applied only to the column bit lines where the pulse is needed. The application of the unnecessary pulses to the bit lines of other columns is eliminated. Thus, the restoration can be applied with less power and with greater speed. It is simple to execute in that the column bit lines to which the pulse needs to be directed are already addressed so that restoration is effected by prolonging the addressing for a short time after a write operation has ended. In a preferred form, the circuit is made even simpler by using the same write drivers to accomplish the restoration as are used to write a bit into an addressed cell.

Another of the several features of the present invention is the provision of separate column bit line addressing multiplexing circuits for reading and writing operations. That is, the multiplexing circuit that connects a desired pair of column bit lines to the sense amplifier for reading the state of an addressed cell is different than the multiplexer circuits that are used to connect those same bit lines to write driving circuits when a bit is to be written into an addressed cell. This separation unloads from the sense amplifier the impedance of the write driving circuits, and thus allows the sense amplifier to more quickly determine the state of an addressed cell. Further, the components in the read multiplexing circuit can be of much smaller size because of the small currents involved in a read operation, while the separate write multiplexing circuits can have circuit elements as heavy as desired for passing the higher currents to the addressed bit lines for writing and write restoration without affecting the speed of the read operations. Additionally, this separation allows the components in each of the read and write multiplexers to be optimized for the single purpose to which they are dedicated.

Additional objects, advantages and features of the various aspects of the present invention will become apparent from the following detailed description of their preferred embodiments, which description should be taken in conjunction with the accompanying drawings

BRIEF DESCRIPTION OF THE DRAWINGS

FIG. 1 illustrates generally a typical computer memory architecture utilizing a number of semiconductor integrated circuit SRAM chips;

FIG. 2 is a circuit diagram of one of the circuit chips used in the array of FIG. 1;

FIG. 3 is a logic circuit of the control logic used in the circuit of FIG. 2;

FIG. 4 shows additional details of other components of the circuit diagram of FIG. 2; and FIGS. 5A through 5L are a timing diagram showing an example of the operation of the SRAM circuit of FIGS. 2-4.

DESCRIPTION OF THE PREFERRED EMBODIMENTS

As background, a SRAM for a computer system is generally described. A plurality of memory chips, such as the chip 11, are each connected to a computer system data bus 13 and address bus 15. The memory chips described as examples in this application are of the type that utilize a chip enable (CE) control signal and a write enable (WE) control signal. A chip having both of these control signals simultaneously active is then in a condition to write data from the data bus 13 into locations specified by an address on the address bus 15. When the chip enable signal is active but the write enable signal is not, then the chips are in condition to have information read from them at a location specified by an address on the address bus 15. An entire array of memory chips are connected to a common write enable signal line 17. The memory chips can be conceptually considered to be organized in rows and columns, where each row of memory chips is connected to a common chip enable signal line, such as the line 19 for the top row of chips of the FIG. 1 array. The row of chips that is enabled is that which contains all of the bit locations for a word of data either being read from the memory or written into it Each bit of such a data word can be located in a different one of a row of memory chips, or alternatively, more than one bit can be located in each memory chip in different organized portions.

As is well known, another type of memory chip uses write (WR) and read (RD) control signals in place of the chip enable and write enable signals illustrated in FIG. 1. In that case, only one of the read or write control signals is activated at one time, the read signal when a read is to be performed, and the write signal when a write is to be performed. Absent either of these signals, a memory chip being controlled by them is disabled. Although the examples of the present invention described herein show one of these types of memory chips, the various aspects of the invention are also applicable to the other type. Indeed, most current microprocessors can deal with either type of memory chips in a computer system.

Referring to FIG. 2, a memory system contained on one of the memory chips of the system of FIG. 1, or on a portion of it, is described. Through a selection circuit 21, a single line 23 of the data bus 13 is utilized. A single bit location on the data bus supplied by the line 23 is that for which single data bits are stored in the circuit of FIG. 2, one such bit for every data word that is stored in the entire memory of which the single bit portion of FIG. 2 is a part.

Each of the bits stored in the memory portion of FIG. 2 is stored in a single bit static cell. The well known circuit configuration of each static storage cell is given for the cell 25. The cells are conceptually, and usually physically, arranged in a plurality of columns, indicated to be "m" number in FIG. 2, and a plurality of rows, indicated to be "n" rows in FIG. 2. Each such cell, indicated by cell 25, includes a bi-state circuit in the nature of a flip-flop which can be represented as a pair of invertor circuits 27 and 29 connected in series. Circuit nodes 31 and 33 between these invertor maintain stable voltages that indicate the state of the cell until a switching voltage is supplied between the nodes 31 and 33. For a typical semiconductor circuit implementation, the power supply voltages are 0 and 5.0 volts. One of the nodes 31 and 33 will be about 0 volts while the other is about 5.0 volts. By convention, the cell 25 is considered to store a digital "zero" bit when its node 31 is 0 volts and the node 33 is 5.0 volts, while considered to store a "1" bit when the voltages on the nodes 31 and 33 are reversed. When in one of these two stable states, the circuit is switched to the other by driving the high voltage node to 0 and applying a voltage to the zero voltage node in excess of 3.5 volts, in a short pulse. Once that pulse is terminated, the state of the cell remains unchanged until another such state reversing voltage pulse is applied between the nodes 31 and 33. Of course, this assumes that the transistors that make up the invertors 27 and 29 remain powered.

The bit cells in a single column, such as the column including the cell 25 which also includes the cell 35, a number of cells not shown and the final cell 37, are connected between a pair of bit line conductors 39 and 41. As can be seen from the cell 25, its nodes 31 and 33 are connected, respectively, to the column bit lines 39 and 41 through respective pass gates 43 and 45. These pass gates are switching transistors having their gates connected to a word line conductor 47. When the signal in the word line 47 is active, the pass gates 43 and 45 are turned on, thus connecting the nodes 31 and 33 to their respective bit lines 39 and 41. When the signal on the word line 47 is inactive, the pass gates 43 and 45 are turned off and the bit cell is isolated from the rest of the memory chip circuit.

Each row of cells, such as the row including the cell 25, a cell 49, several other cells not shown, and a cell 51, are connected to a common word line, such as the word line 47. Each of the cells in a row, then, are either connected or not connected to their respective pair of column bit lines, depending upon the state of their common word line.

Only one bit cell of the array shown in FIG. 2 is addressed at one time in order to determine its state by reading or changing its state by writing. The row and column in which a cell lies whose address is presented on the address bus 15 is determined by row decoding circuits 53 and column decoding circuits 55. The row decoding circuits 53 activate one of the rows of cells by activating the appropriate word line for the address on the address bus 15, when enabled by a signal in a line 57. The address on the address bus 15 is also decoded by the circuits 55, which presents in a plurality of lines 59 signals which cause the correct pair of column bit lines to be connected to either a single reading circuit or a single writing circuit.

The primary element of the reading circuit is a sense amplifier 61 having voltage input lines 63 and 65. An output 67 of the sense amplifier 61 has a polarity dependent upon which of the inputs 63 and 65 is higher than the other. That output 67 is applied to buffering and latching circuits 69 where the state of an address cell is stored as a "0" or "1", depending upon the polarity of the output 67 of the sense amplifier at an appropriate instant in the reading cycle. That read bit cell state is then applied to the data bus through the line 23.

The main components of the writing circuit are individual bit line driver amplifiers 71 and 73. These driving amplifiers have outputs 75 and 77 that may be driven to have a voltage difference, such as about 5 volts, sufficient to switch the state of a cell to be written. This differential writing voltage output is turned on by an appropriate signal in respective input lines 79 and 81. The output of the driving amplifiers 71 and 73 are held to be about +5.0 volts unless its input becomes active, at which instant its output goes to the lower voltage. Thus, when one of the input 79 and 81 is inactive while the other is active, a voltage difference exists between a driver output line 75 and 77 sufficient to change the state of a bit cell, such as by applying it to the nodes 31 and 33 of the bit cell 25.

The state of the input 79 and 81 is developed by buffering and decoding circuits 83 that keep one of its output lines 85 and 87 inactive while the other is active, depending upon whether a data bit on the bus line 23 is a "0" or a "1". The lines 85 and 87 are connected respectively to the driver input lines 79 and 81 through OR-gates 89 and 91. As explained hereinafter, a second input to the OR-gates 89 and 91 normally causes the outputs of the drivers 71 and 73 to both be high for pre-charging a selected pair of bit lines, except when a writing operation is being performed. During a writing operation, the outputs of the drivers 71 and 73 are made unequal, as described above.

The pair of bit lines in a column containing the cell to be addressed is connected to either the reading or writing circuit by operation of four switching circuits (multiplexers) 93, 95, 97 and 99 by the signals in the lines 59. The usual arrangement for SRAMs is to have two such switching circuits, one to select the first bit line of an addressed column and the other to select the other bit line of the addressed column. Both of the switching circuits in this usual arrangement connect the addressed column bit lines to a writing and a reading circuit. In this usual arrangement, the writing circuits are disabled when a read operation is desired but they remain connected to the bit lines during a read. However, the SRAM of the present invention employs separate switching circuits for connection of the column bit lines to the reading and writing circuits. The switching circuits 93 and 97 select one of the pair of bit lines of an address column to be connected to input lines 63 and 65 of the read sense amplifier 61. Switching circuits 95 and 99 receive, respectively, the output lines 75 and 77 of the driving amplifiers 71 and 73 for connecting them to the pair of bit lines in an addressed column of memory bit cells.

Referring to FIG. 4, an example implementation of the read switching circuit 93 and the write switching circuit 95 are shown. These circuits control connection of the reading and writing circuitry, respectively, to the left-hand bit line of each pair of column bit lines. The switching circuits 97 and 99 are similarly constructed and operate in the same way, but with respect to the right-hand bit line of the pairs of column bit lines.

In its simplest form, each bit line has a series switching transistor connected in series with it, such as transistor 101 for the left-hand column of FIG. 2, another switching transistor for the next-to-the-left-hand column of bit cells, and so forth. An AND-gate 105 turns the transistor switch 101 on when a bit cell in the left hand column of cells is addressed by a proper signal in one of the lines of the decoded column address lines 59 and an active signal in a read column MUX enable line 107. Similarly, the transistor 103 is caused to be conductive when its line in the decode column address lines 59 becomes active at the same time that the enable signal in line 107 becomes active. The result is to connect one of the left-hand bit lines of a column to the sense amplifier input line 63.

The write switching circuits 95 are similarly constructed A switching transistor 111, for example, is connected in series with the driver output line 75 and the bit line 39 of the left-hand-most column. That switching transistor is turned on when both of the inputs to an AND-gate 113 are active. Those inputs are from one of the lines from the decoded column address lines 59 and a right column MUX enable line 15. The particular arrangement of switching transistors in the switching circuits 93–99 may vary from that shown in FIG. 4 for particular applications. An example is when there are a very large number of bit lines and it is more efficient to use a tree connection of switching transistors.

It may seem strange that separate switching circuits are used for connecting the reading and writing circuits to the column bit lines of a column where an addressed bit cell exists. However, there are many advantages, thus making the extra circuitry very worthwhile. One advantage is that the switching transistors 101, 103, etc. of the read switching circuit 93 can be made to have much smaller size than what is required for handling the writing current in the write switching circuits 95. If only one set of switches is used, they must be sized for the higher current but since the read switching circuit 93 does not carry write currents, the switching transistors can be made small in size with the resulting reduction in their capacitance.

The reason that this is beneficial is that the voltages in the column bit lines change faster during a reading operation. It is desired to keep the bit lines of a column having a cell to be read at substantially equal voltages, usually at the higher end of the cell voltage range, namely about 3.5 volts. When a cell to be read is then connected to those bit lines upon an active signal occurring in its word line, it is desired to determine which side of the cell is at zero volts long before the bit line to which it is connected actually reaches zero volts. The sense amplifier 61 is very sensitive to changes in voltage and can detect which of the pair of bit lines of an addressed column connected to its input lines 63 an 65 is tending to move away from the starting 3.5 volts and towards zero. This is preferably accomplished by sensing a drop in the voltage of one of the bit lines of only a few hundred millivolts. By using a switching circuit 93 only for reading, its transistors can be made smaller than usually employed, thus reducing their capacitance and increasing the speed at which that change can be detected. In the present invention, all but one of the larger transistors in the write switching circuits 95, with their large parasitic capacitive load, are no longer connected to the output of the bit line read MUX, thus reducing the load on this critical point.

Another advantage of separating the read and write column bit line switching circuits is that each may have its switching transistors configured to conform to the different requirements. For example, the switching transistors 11, 103, etc., of the read circuit 93 are preferably made of p-channel devices since that type of device is best for use with the higher voltages encountered in reading the cell. The switching transistors 111, etc. of the write circuit 95, on the other hand, are preferably made of n-channel devices which are better suited for switching the bit line to zero volts for writing an addressed cell.

Many aspects of the design of the SRAM being described are directed toward maintaining the column bit lines at an equal, higher voltage at all times, restricting the amount that the voltage of one line can drop during a reading operation, and restoring that equal voltage as soon as possible after the bit lines of a particular column have been intentionally driven very far apart during a write operation. One of the mechanisms for assisting in this is a precharge circuit, such as the precharge circuit 121, connected to both of the pair of bit lines for a single column of bit cells. Circuit 121 is provided for the left-hand-most column of bit cells of FIG. 2, a similar but separate circuit 123 for the next-to-the-left column of storage cells, and similar circuits for each of the other columns of cells not shown, ending with a precharge circuit 125 for the right-hand-most column. The purpose of each precharged circuit is to pull up its associated pair of bit lines toward the higher supply voltage $V_{cc}$, usually 5.0 volts.

This is accomplished by three different mechanisms. The first mechanism uses a pair of transistors 129 and 131 connected between the voltage supply 127 and the bit lines 39 and 41, respectively. These transistors remain turned on all the time and are connected to act as high impedance resistors. The impedance is high enough so that this connection does not interfere with a read operation, wherein a voltage drop in one of the column bit lines is detected, or in a write operation, where one of the bit lines is driven by the writing circuits to something very close to zero volts.

A second mechanism is another pair of transistors 133 and 135 which are again connected between the voltage supply terminal 127 and the pair of bit lines 39 and 41, respectively. The transistors 133 and 135 are made to be of substantially lower impedance than transistors 129 and 131, but are not left in their conductive state all the time. The gates of the transistors 133 and 135 are connected together and to a read limiter control signal control line 137. Generally, these transistors are conductive except during the time that writing is to occur. An example of this control signal is shown in FIG. 5F, where a high level of the signal is its active state wherein the transistors 133 and 135 are made to be conductive.

The third mechanism of the precharge circuit that aids in maintaining the column bit lines at an equal voltage is an equalizer transistor 139 which is connected between the pair of bit lines of its associated column. The gate of the equalizer transistor 139 is connected to a write equalizer signal control line 141. Generally, the control signal line 141 is active, thus turning on the transistor 139, for a very short time after either a change of address in the address bus 15 or when the write enable (WE) control signal in line 17 becomes disabled, as shown in FIG. 5G. The transistor 139 is also turned on when both of the chip enable (FIG. 5A) and write enable (FIG. 5B) control signals are inactive.

The most extreme case of the bit line voltages being unequal occurs immediately after a write operation, after the bit lines have intentionally been driven apart. Yet another mechanism is provided, in addition to those of the precharging circuits just described, in order to assist the bit line driven to near zero volts to recover to its higher voltage. A restoring pulse of equal voltages is applied to each of the bit lines of a column immediately after a write operation. The pulse is applied only to the column where the write has just occurred, rather than to all of the columns as in the case of the precharging circuits. This is accomplished in the preferred form by directing the pulses to the pair of bit lines through bit line write switching circuits 95 and 99 while they are still configured to have the bit lines of the column just written to connected to the outputs 75 and 77 of the driving amplifiers 71 and 73. During this postwriting restoring operation, both driver amplifiers 71 and 73 are driven by a control signal in a line 145 to their high voltage state. That line is connected to second inputs to each of the OR-gates 89 and 91, with the result that the output of each of the driver amplifiers 71 and 73 is at the high voltage.

The bit line which has just been driven substantially to zero during the write operation is then immediately switched to the high voltage for a very short time after the addressed cell just written to has been disconnected from the bit lines by its word line signal going inactive. This is accomplished during the short time that both the control signal in line 145 and the write switching circuit control signal in line 115 are active, as shown in an example of FIGS. 5I and 5J. A significant advantage of applying a pulse only to the column where needed is the reduced power consumption of repeatedly sending those pulses through circuit elements. The write switching circuits are adapted for channeling the pulse to the one column where it is needed after a write operation has occurred. By using the same driver amplifiers as used during the write operation, additional circuitry and complexity that could be involved in developing such a restoration pulse is avoided.

As previously stated, a significant goal of the precharging circuit and the recovery pulse is to either keep the column bit lines at a substantially equal voltage for fast read operations, or to restore them to that condition as fast as possible. Another result of these maintenance and recovery operations is to reduce the possibility of inadvertently changing the state of a bit cell that is addressed for a reading operation, as might happen if its column bit lines had very unequal voltages. If the voltage across a pair of column bit lines is unequal enough, the state of the cell can be changed when it is first connected to those bit lines for a reading operation. One way to assure that this does not happen is to slow down the operation of the memory, but it is certainly preferable to employ the techniques described above with respect to the precharging circuit and the post-write recovery technique.

The various control signals discussed are generated by a control logic 147 circuit of FIG. 2. This logic, an example of which is given in FIG. 3, receives as inputs the data bus 13 (FIG. 5D), the address bus 15 (FIG. 5C), the write enable (WE) control signal in line 17 (FIG. 5B) and the chip enable (CE) control signal in line 19 (FIG. 5A).

The most complicated portion of the logic of FIG. 3 is that required to generate the control signal in the word line 57. When that control signal is active, one of the row word lines selected by the row decoding circuits 53 then becomes active. Rather than allowing the word lines to be active at all times when a read or a write operation is occurring, it is preferable to enable the word lines, and thus connect an addressed cell to its pair of column bit lines, only for a time duration after an event that commences a read or write operation. This advantageously causes an addressed cell to be disconnected from its pair of column bit lines after enough time has passed for the read or write operation to have been accomplished, thus reducing the contribution of the connected cell to causing its column bit lines to be at unequal voltages. A series of word line enabling pulses is shown in FIG. 5E. The control signal in line 57 can also be used to turn on power to high power consumption components of the circuit, such as the sense amplifier, so that they are used only when they are needed.

Referring to FIG. 3, a detection circuit 151 generates a short pulse in a line 153 whenever one or more bits change on the address bus 15. Similarly, a circuit 155 generates a like pulse in a line 157 when one or more bits on the data bus 15 changes. Another circuit 159 generates a pulse in a line 161 when the write enable signal in the line 17 goes active. Yet another similar circuit 163 is provided to generate a short pulse in a line 164 when the chip enable (CE) control signal in the line 19 goes active. These four events are monitored and word line control pulse is generated in the line 57 upon a certain combination of them.

A three-input terminal OR-gate 165 has an output that is applied as one input to an AND-gate 167. The output of the AND-gate 167 is one of two inputs to an OR-gate 169. Whenever a pulse from any of the four original sources is allowed to pass through to the output of the OR-gate 169, a longer pulse is generated in the line 57 by a pulse generator 171.

Such a pulse is generated whenever the chip enable signal in the line 19 goes active, as detected by the pulse in line 163 which passes directly through the OR-gate 169. The three other events detected by the circuits 151, 155 and 159 will cause a pulse to be generated by the circuit 171 only when the chip enable signal in the line 19 is active, as controlled by connecting the line 19 to the second input of AND-gate 167. So long as the chip enable (CE) signal is active, either the event of the write enable (WE) signal going active or an address change in the bus 15 will, through the pulse inputs 161 and 153 to the OR-gate 165, cause a pulse to be initiated by the pulse generator 171. As a fourth condition which will initiate such a pulse, a change in data on the bus 13 will cause initiation of such a pulse but only so long as the write enable (WE) signal is active, since the line 17 and the line 157 are connected as inputs to an AND-gate 173 whose output is one of the inputs to OR-gate 165.

As previously mentioned, the write equalizer signal in line 141 is a pulse that occurs after either an address bus change or the event of the write enable (WE) signal going inactive. The latter condition is detected by a circuit 175 that generates a pulse in a line 177 when the write enable signal goes inactive. The line 177 and the line 153 are connected as inputs to an OR-gate 179 whose output is the line 141. The ORgate 179 passes either of these pulses through to the line 141. The example equalizer control signal of FIG. 5G shows a pulse 182 that is the result of an address change. Another pulse 184 is initiated by the WE signal (FIG. 5B) going inactive, while its duration is prolonged by the occurrence of another address change before the pulse from the detecting circuit 175 has terminated. The write equalizer signal is also forced to an active state during the time that the chip enable signal in line 19 is inactive, as sensed by an invertor 180 whose output is connected as a third input to the OR-gate 179.

The read limiter signal in line 137 remains active unless both the chip enable (CE) and write enable (WE) signals are both active. This is shown in the timing diagram of FIG. 5F. This is accomplished by the logic of FIG. 3 with an AND-gate 181 having as its two inputs the lines 17 and 19. An output of the gate 181 is connected to an invertor 183. Thus, when both the write enable and chip enable signals are active, the invertor 183 drives the signal in the line 137 inactive.

The signal in the line 107 to enable the column read switching circuits 93 and 97 is simply taken from the chip enable signal in the line 19. An example is shown in FIG. 5H.

The enabling signal in the line 115 for the column addressing switching circuits 95 and 99 used for writing is somewhat more complicated, however. Through an OR-gate 185, the enable signal is present in line 115 whenever both the write enable (WE) and chip enable (CE) control signals are active. This is accomplished by connecting one of the inputs of the OR-gate 185 to the output of the AND-gate 181. A second input to the OR-gate 185 is a pulse generator circuit 197 that initiates a pulse of a defined duration in response to a pulse from a circuit 189 that detects either the write enable (WE) or chip enable (CE) signals going inactive. The result of the combination is to keep the writing circuits connected to an addressed pair of column bit lines for the duration of the write enable pulse, as one might expect, but then also for a time immediately thereafter that is determined by the pulse length of the pulse generator 187. This is indicated in the example of FIG. 5I.

It is during this extended duration of the pulse of the pulse generator 187 that the writing circuit is used to apply a recovery pulse through the write switching circuits 95 and 99 to the same pair of column bit lines that were just written to. The driver amplifiers 71 and 73 are both driven positive by a driver force signal in line 145 that becomes active immediately after a writing cycle, after having been inactive during the writing cycle.

FIGS. 5K and 5J indicate voltages in an example pair of column bit lines during the several reading and writing operations given in the example of FIG. 5. For this example, it is assumed that all the read and write operations shown occur in the one column having bit lines 39 and 41, so that a continuous swing of voltages in a pair of bit lines can be illustrated. Of course, in normal operation, cells in various columns will be successively accessed.

Although the various aspects of the present invention have been described with respect to its preferred embodiments, it will be understood that the invention is entitled to protection within the full scope of the appended claim.

It is claimed:

1. In a static random access semiconductor memory having a large number of individual bit storage cells arranged in a plurality of columns by connection between a pair of bit lines provided for each column, the combination comprising:
   writing means for applying unequal voltages to a pair of column bit lines to which it is connected for changing the state of a cell connected to those bit lines,
   addressing means responsive to an address of a particular cell and including a switching network for connecting said writing means to a selected single pair of column bit lines, and
   restoring means connected to said addressing means for connecting a source of substantially equal voltages to the single addressed column pair of bit lines through said switching network for a time after said writing means applies an unequal voltage thereto.

2. The combination of claim 1 wherein said writing means and said restoring means each include a common pair of bit line voltage drivers.

3. The combination of claim 1 wherein said addressing means is independent of any circuitry for selecting column bit lines for connection to a cell state reading circuit.

4. In a static random access semiconductor memory having a large number of individual bit storage cells arranged in a plurality of rows and columns and which each include a pair of semiconductor switches controllable by a word line for a row in which a cell exists to connect that cell across one of a pair of bit lines provided for each column of cells, the combination comprising:
   writing means for applying unequal voltages to a pair of column bit lines to which it is connected for changing the state of a cell connected to those bit lines by activation of the cell's word line,
   write addressing means responsive to an address of a particular cell for connecting said writing means to a selected single pair of bit lines of the column in which the addressed cell lies, and
   restoring means connected to said addressing means for applying substantially equal voltages from a voltage source to the addressed column bit lines for a time after said writing means applies an unequal voltage thereto and immediately after a cell has just been written.

5. The combination of claim 4 wherein
   said writing means includes a pair of driving amplifiers, outputs of which are connectable individually to a pair of addressed column bit lines, and means for causing said driving amplifier outputs to be driven to opposite high and low voltage levels, and
   said restoring means includes means for causing said driving amplifier outputs to be driven to substantially the same high voltage level.

6. The combination of claim 4 which additionally comprises:
   reading means receiving a voltage from across an addressed cell when connected to its column bit lines, and
   read addressing means responsive to an address of a particular cell for connecting said reading means to a selected single pair of column bit lines, said reading addressing means being substantially independent of said write addressing means.

7. In a static random access semiconductor memory having a large number of individual bit storage cells arranged in a plurality of columns by being made connectable between a pair of bit lines provided for each column, the combination comprising:
   writing means for applying unequal voltages to a pair of column bit lines to which it is connected for changing the state of a cell connected to those bit lines,
   write addressing means responsive to an address of a particular cell and including a first switching network for directly connecting said writing means to a selected single pair of column bit lines,
   reading means receiving a voltage from across an addressed cell when connected to its column bit lines, and
   read addressing means responsive to an address of a particular cell and including a second switching network for directly connecting said reading means to a selected single pair of column bit lines, said first and second switching networks being separate from each other.

8. The combination of claim 7 wherein said first switching network includes a first plurality of pass gates and said second switching network includes a separate second plurality of pass gates, said first plurality of pass gates being characterized by having a larger current carrying capability than said second plurality of pass gates.

9. The combination of claim 8 wherein said first plurality of pass gates are further characterized by being n-channel type transistors and said second plurality of pass gates are further characterized by being p-channel type transistors.

10. The combination of claim 7 which additionally comprises restoring means connected to said first switching network for applying a substantially equal voltage to the addressed column bit lines for a time after said writing means applies an unequal voltage thereto.

11. A semiconductor static random access memory integrated circuit chip of a type having terminals for connection to a data bus, an address bus, a chip enable signal and a write enable signal, comprising:

a plurality of individual bit bi-state storage cells arranged in a plurality of rows and columns, each of said cells including a storage circuit having two terminals, one of the terminals having a higher voltage than the other depending upon the state of the cell, the state of which can be changed by impressing a voltage pulse across said terminals that is opposite to the voltage of the cell across the terminals, a word line connected to the individual cells in a row of cells, a pair of bit lines for each column of cells, each cell in a column having its pair of terminals connectable thereto through a pair of pass gates that are switched in response to an active signal on the word line connected thereto, writing means for applying said opposite voltage pulse to an addressed cell, write addressing means including a first plurality of pass gates and responsive to a signal on the address terminals and to a first control signal for connecting a single pair of column lines directly to said writing means, reading means for detecting the state of an addressed cell by the voltage across its terminals, read addressing means including a second plurality of pass gates and responsive to a signal on the address terminals and said chip enable terminal for connecting a single pair of column lines directly to said reading means, said first and second plurality of pass gates being connected in separate switching networks, control means responsive to signals on the chip enable and write enable terminals for generating said first control signal to extend for a time that includes the duration of the pulse of the writing means plus another period of time after the writing pulse has terminated, and means connected to said written addressing means for driving the addressed column bit lines to equal high voltage levels during said another period of time.

12. In a static random access semiconductor memory having a larger number of individual bit storage cells arranged in a plurality of columns and connectable between a pair of bit lines provided for each column to read and write their bit storage state, the combination comprising:

means connectable to an addressed pair of column bit lines for independently applying voltages thereto, writing logic means connected to said voltage applying means for causing said voltage applying means to apply unequal voltages to a connected pair of column bit lines, thereby to change the state of a cell connected to the connected bit lines, and restoring logic means connected to said voltage applying means for causing said voltage applying means to apply a substantially equal voltage to the connected pair of column bit lines for a time after applying an unequal voltage thereto, thereby to restore the voltage of a bit line pair in which the state of a cell has been changed by applying an unequal voltage thereto.

13. The combination of claim 12 wherein said voltage applying means includes a pair of bit line drivers that are each independently controllable by signals from said writing logic means and restoring logic means to drive a single one of the addressed pair of column bit lines to either a high or a low voltage.

14. In a static random access semiconductor memory having a large number of individual bit storage cells arranged in a plurality of rows and columns and which each include a pair of semiconductor switches controllable by a word line for a row in which a cell exists to connect that cell across one of a pair of bit lines provided for each column of cells, the combination comprising:

a pair of bit line drivers that each provide at an output a high or low voltage in response to an individual control input signal thereto, column addressing means responsive to an address of a particular cell for connecting the outputs of said bit line drivers to a selected single pair of bit lines of the column in which an addressed cell lies, row addressing means responsive to an address of the particular cell for activating a word line to which the particular cell is connected, thereby to connect that cell and other cells in a row to their respective bit line pairs, writing logic means providing individual control signals to the bit line drivers for applying an unequal voltage to a pair of column bit lines to which they are connected in a manner to change the state of a cell connected to those bit lines by activation of its word line, and restoring logic means providing individual control signals to the bit line drivers for applying a substantially equal voltage to the addressed column bit lines for a time after said writing means applies an unequal voltage thereto and immediately after a cell has just been written.

* * * * *